United States Patent [19]

Fiorina et al.

[11] Patent Number: 4,772,999
[45] Date of Patent: Sep. 20, 1988

[54] STATIC CONVERTER, ESPECIALLY FOR AN UNINTERRUPTIBLE ELECTRICAL POWER SUPPLY SYSTEM

[75] Inventors: Jean-Noël Fiorina, Grenoble; Hervé Denis, Echirolles, both of France

[73] Assignee: Merlin Gerin, Grenoble, France

[21] Appl. No.: 126,716

[22] Filed: Nov. 30, 1987

[30] Foreign Application Priority Data

Dec. 16, 1986 [FR] France .................................. 8617709
Dec. 16, 1986 [FR] France .................................. 8617710

[51] Int. Cl.$^4$ .............................................. H05K 7/20
[52] U.S. Cl. ..................................... 363/141; 363/144; 361/388
[58] Field of Search ................ 363/141, 144; 361/386, 361/389, 388, 427, 429; 357/81; 165/80.2

[56] References Cited

U.S. PATENT DOCUMENTS

| 2,394,060 | 2/1946 | Holmes . | |
| 3,364,395 | 1/1968 | Donofrio et al. | 361/386 |
| 4,007,402 | 2/1977 | Allport | 363/141 |
| 4,015,173 | 3/1977 | Nitsche | 363/141 |
| 4,177,499 | 12/1979 | Volkmann | 361/386 |
| 4,337,499 | 6/1982 | Cronin et al. | 361/386 |
| 4,731,703 | 3/1988 | Tsukaguchi et al. | 363/141 |

FOREIGN PATENT DOCUMENTS

| 0026443 | 4/1981 | European Pat. Off. . |
| 2747712 | 4/1979 | Fed. Rep. of Germany . |
| 3503813 | 8/1986 | Fed. Rep. of Germany . |
| 2011668 | 1/1969 | France . |
| 2416621 | 8/1979 | France . |
| 2577102 | 8/1986 | France . |

OTHER PUBLICATIONS

IRE National Convention Record, vol. 7, pp. 148-157.
Electro and Mini/Micro Northeast, New York pp. 1-5, Apr., 1985.

Primary Examiner—Peter S. Wong
Attorney, Agent, or Firm—Parkhurst, Oliff & Berridge

[57] ABSTRACT

A converter comprises a plurality of modules each having a heat-sink unit with a base-plate made of a good heat-conducting metal material, acting as a support for the electronic components, a pair of parallel flanges laterally fixed to the opposite edges of the base-plate, and a rear plate for connection of the draw-in contacts capable of cooperating with the studs of a fixed connecting base. Error prevention means, formed by pins and orifices prevent any module connection error. The draw-in contacts are achieved by tulip-fingers or grips capable of being housed in six holes of the connection plate. The assembly forms a rack which can be actuated by a handle.

10 Claims, 11 Drawing Sheets

# STATIC CONVERTER, ESPECIALLY FOR AN UNINTERRUPTIBLE ELECTRICAL POWER SUPPLY SYSTEM

BACKGROUND OF THE INVENTION

The invention relates to a static converter having a plurality of electronic power modules, each equipped with a heat-sink unit with a heat dissipation base-plate, made of a good heatconducting metal material, comprising a support face acting as a support for the electronic power components, and an opposite face equipped with cooling fins.

The prior art modules generally speaking require complicated wiring to connect up the various electronic components of the converter, and for connection with the juxtaposed modules or load circuits. This results in bulky dimensions of the housing in which the heat-sink unit of each module is located.

SUMMARY OF THE INVENTION

The object of the invention consists in reducing the dimensions of the electronic power modules, and in achieving compact standard modules regardless of the converter type.

Each electronic module according to the invention is characterized in that the heat-sink base-plate comprises a pair of parallel flanges, laterally fixed to the opposite edges of the base-plate in a perpendicular direction to the support face, and a connecting plate with draw-in contacts electrically connected to the electronic components, the module being arranged in a parallelipipedic rack capable of cooperating in translation with a fixed connecting base by drawing the plate contacts, made of insulated material, into adjoining studs of the base, each flange of the module being provided with a longitudinal groove to guide the rack when drawing-in takes place by sliding along a slide securedly united to the connecting base.

The metal flanges are in good thermal contact with the base-plate and participate with the fins in dissipating the heat generated by the electronic components.

Such an arrangement of the module in rack form makes it easier to draw-in to engage with the connecting base and avoids a special enclosure having to be used to house the assembly. A draw-out handle simply has to be added on the front panel of the module for draw-in and draw-out operations to be carried out.

Any connection error is eliminated by the use of error prevention means comprising a series of pins and orifices distributed over the rack connection plate and the connecting base, in such a way as to draw up a predetermined connection coding of the module contacts with the aligned studs of the connecting base.

The rack is guided in translation by the two slides of the base throughout the travel of the module. Accurate centering is furthermore exerted on the connection plate when the draw-in contacts are inserted in the fixed studs of the connecting base.

The draw-in contacts of the module connection plate are advantageously formed by tulip-finger contacts or grips.

The fixed connecting base comprises at least one support plate of the draw-in studs, said support plate made of insulating material being fitted between two vertical brackets extended by two straight arms constituting said slides cooperating in sliding with the guiding grooves of the flanges when the rack is drawn-in.

The corresponding bracket-and-slide assembly is achieved by casting a single T-shaped insulating part, the bracket having clip-on parts allowing modular assembly of the connecting base.

The electronic components can be fitted anywhere on the heat-sink base-plate due to the presence of several parallel grooves extending over the whole length of the block.

The components are fixed by means of self-tapping screws screwed into the grooves.

Cooling of the static converter modules is achieved by means of a ventilation unit providing forced air circulation inside the cubicle housing the modules. The ventilation unit comprises a fan having a main discharge orifice facing the front panel to establish a first internal cooling air path F1 after the air contained in the front space situated between the modules and the front panel has been pressurized, and a secondary discharge orifice, located opposite the main orifice, to generate a second internal cooling air path towards the transformer, the dimension of the secondary orifice being smaller than that of the main orifice.

The fan and the transformer are supported by a support separated from the bottom of the cubicle by a space via which the air is sucked through said inlet orifice. The two cooling air paths are independent from one another and are arranged parallel between the discharge orifices and the outlet orifice, the latter being located above the modules and in proximity to the cubicle roof panel.

The presence of these two cooling air paths means that the temperature inside the cubicle can be kept uniform, and that efficient cooling of all the components making up the static power supply can be provided.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
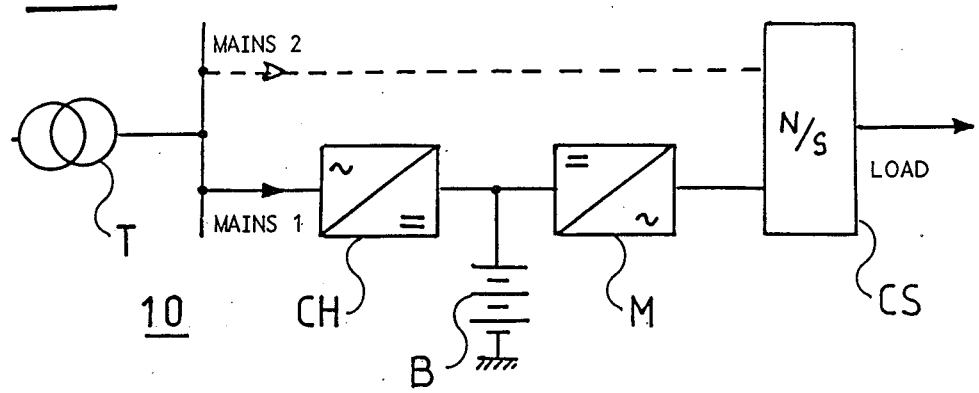
FIG. 1 is a single-line wiring diagram of an uninterruptible power supply system.

FIG. 1 shows the single-line electrical diagram of a static uninterruptible power supply system 10, comprising a rectifier-charger CH, connected to a first mains system 1, an inverter M for DC/AC conversion and a battery bank B arranged as a buffer. The battery B constitutes a permanently available power store at the input terminals of the inverter M. A normal/standby changeover device N/S fitted between the inverter M and the load is equipped with a static contactor CS to ensure automatic switching without interruption from the first mains system 1 to a second mains system 2. Operation of a power supply of this kind is well-known in the art and it is sufficient to recall that when the voltage is present on the first mains system 1, the power is supplied to the load via the rectifier-charger CH which performs the AC/DC conversion. When the voltage supply on the first mains system 1 is unavailable, the supply of the inverter M is instantaneously transferred from the rectifier-charger CH to the battery B without any disturbance for the load.

The battery B supplies the necessary power to the inverter M within the limits of its autonomy. After the voltage supply has returned on the first mains system 1, the rectifier-charger CH again supplies the inverter M, and recharges the battery B.

In case of an overload on the load side or of a power supply fault, the load receiver is immediately connected to the second mains system 2 by means of the changeover switch N/S with static contactor CS, and is not subjected to any disturbance. Return to operation on the inverter M takes place automatically at the end of the overload.

The two mains supplies 1 and 2 of the static power supply system 10 can be connected to a single-phase or three-phase transformer T of a main low voltage switchboard, whose protective switchgear has not been represented.

Figure 2:
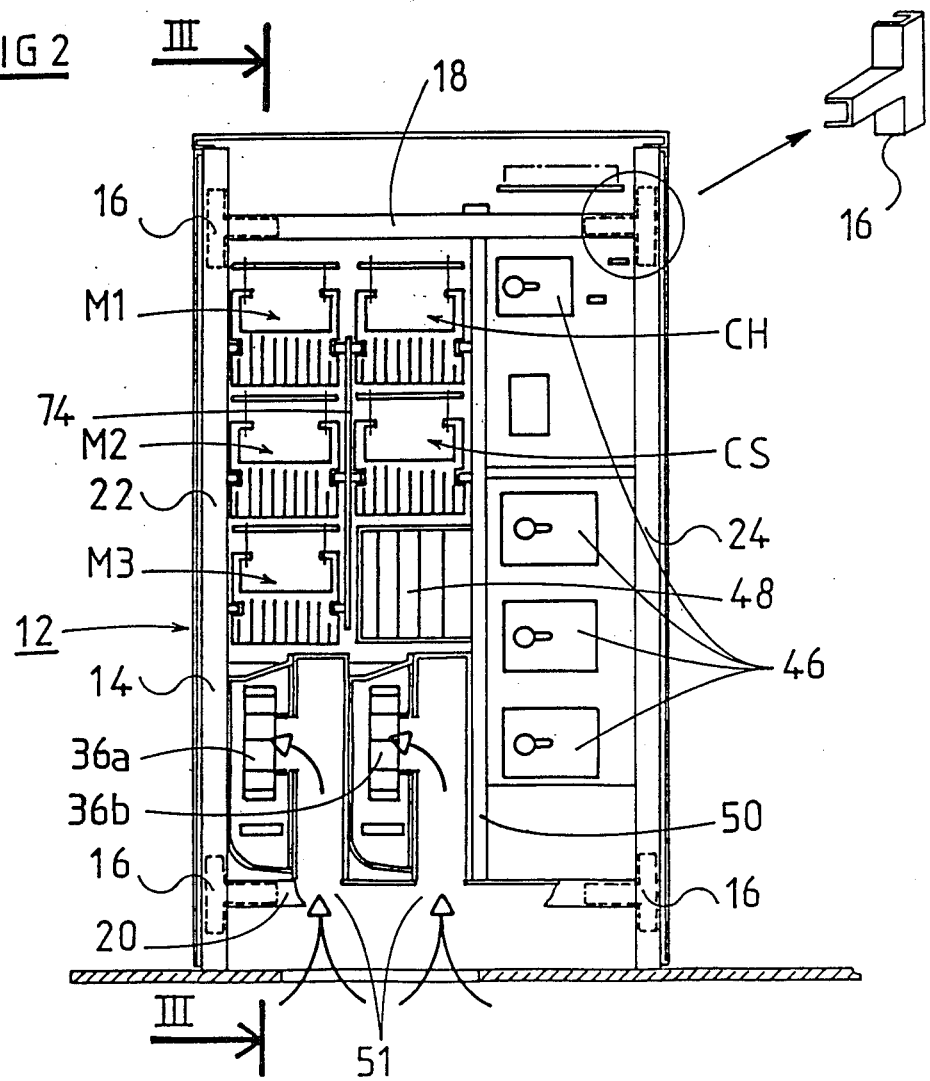
FIG. 2 is a schematic elevational view of the cubicle with the front panel removed.

The static power supply system 10 is housed in a cubicle (FIGS. 2 and 3) having a metal frame 14 in the shape of a straight parallelipiped. The front part of the frame 14 comprises four T-shaped assembly brackets 16, capable of being clipped at each corner into upper and lower cross-members 18, 20, and into opposite vertical flanges 22, 24, parallel two by two. The rear part of the frame 14 comprises an upper cross-member 26 acting as support for the roof panel 28, and a horizontal plate 30 supporting a transformer 32 associated with the operating system of the inverter M. The lower cross-member 20 forms part of a horizontal plate 34 supporting a ventilation unit 36. The two plates 30, 34 are coplanar and are separated vertically from the base plate 37 of the cubicle 12 by a space 38.

The upper cross-member 26 of the rear framework comprises an outlet orifice 39 equipped with a ventilation grate 40 through which the upper volume of the cubicle 12 communicates with the ambient air. A rear panel 42 connects the upper cross-member 26 to the lower plate 30, and extends parallel to the front panel 44 of the cubicle 12.

The front panel 44 is provided on the left with a first door giving access to the various electronic sub-assemblies of the static power supply system 10 comprising the stack modules M1, M2, M3 of the inverter M, the rectifier-charger module CH, and the normal/standby switch module with static contactor CS, and on the right a second door enabling access to be had to the electrical protective and insulating switchgear 46, comprising disconnectors, switches or circuit breakers. A rack 48, having monitoring and control printed circuit PC board, is located underneath the static contactor module CS and next to the bottom stack M3 associated with one of the phases of the inverter M.

A vertical intermediate frame 50 (FIG. 2) separates the various electronic sub-assemblies from the electrical switch-gear 46. Each vertical-axis door is supported by two hinges (not shown) flush-mounted in the two assembly brackets 16 located on the same side of the front part of the frame 14.

Figure 3:
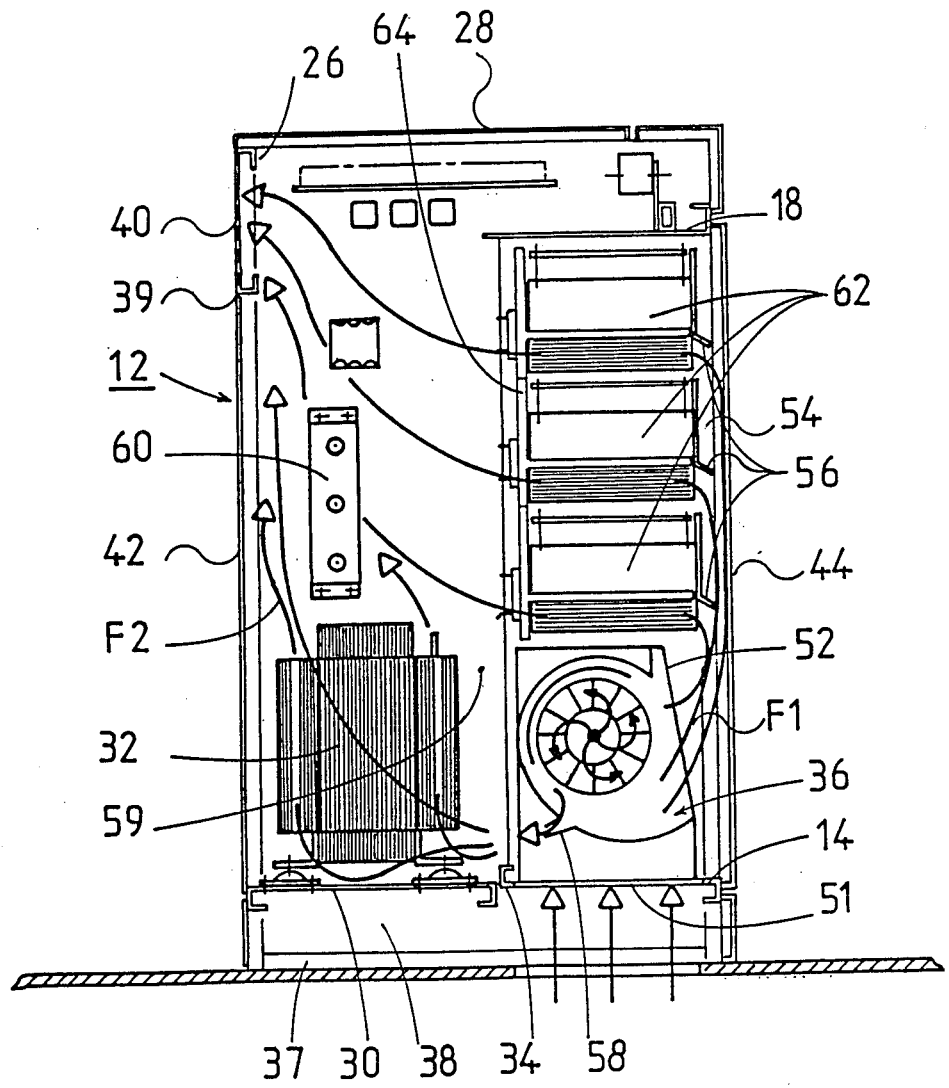
FIG. 3 shows a cross-sectional view according to the line III—III of FIG. 2.

The ventilation unit 36 is fitted in the lower volume of the cubicle 12 on the left-hand door side and comprises a pair of fans 36 a, 36 b, located side by side on the plate 34. The ventilation air of the two fans 36 a, 36 b, is sucked laterally through an inlet orifice 51 from the downstream space 38, and is forced towards the outlet orifice 39 along two internal cooling paths, indicated by the arrows F1 and F2 (FIG. 3). The first path F1 is outlet from the main discharge orifice 52 of the fans 36 a, 36 b, and pressurizes the front space 54 of the cubicle 12 situated between the electronic sub-assemblies and the front panel 44. This results in a forced horizontal air-flow depthwise in the cubicle, in such a way as to efficiently cool the various modules M1, M2, M3, CH and CS making up the electronic subassemblies, and also the PC board rack 48. The horizontal air-flow is enhanced by the presence of turbulence grates 56, fixed to the rear part of the modules. Each grate 56 is slightly inclined downwards, and protrudes into the space 54 to intercept the rising air-flow coming from the main discharge orifice 52.

The second air path F2 is generated by a secondary discharge orifice 58 of the fans 36 a, 36 b, directed towards the transformer 32 of the inverter M, located in the lower rear compartment 59 of the cubicle 12. The secondary orifice 58 is smaller than the main discharge orifice 52 and the two cooling air paths F1, F2 are independent from one another being arranged parallel between the discharge orifices 52, 58 of the fans 36 a, 36 b, and the outlet orifice 39 of the cubicle 12.

The ventilation air of the second path F2, in addition to cooling the transformer 32, also cools the other components of the power supply system 10, notably the filter capacitors 60 fitted in the middle part of the cubicle 12 between the outlet orifice 39 and the transformer 32.

Figure 4:
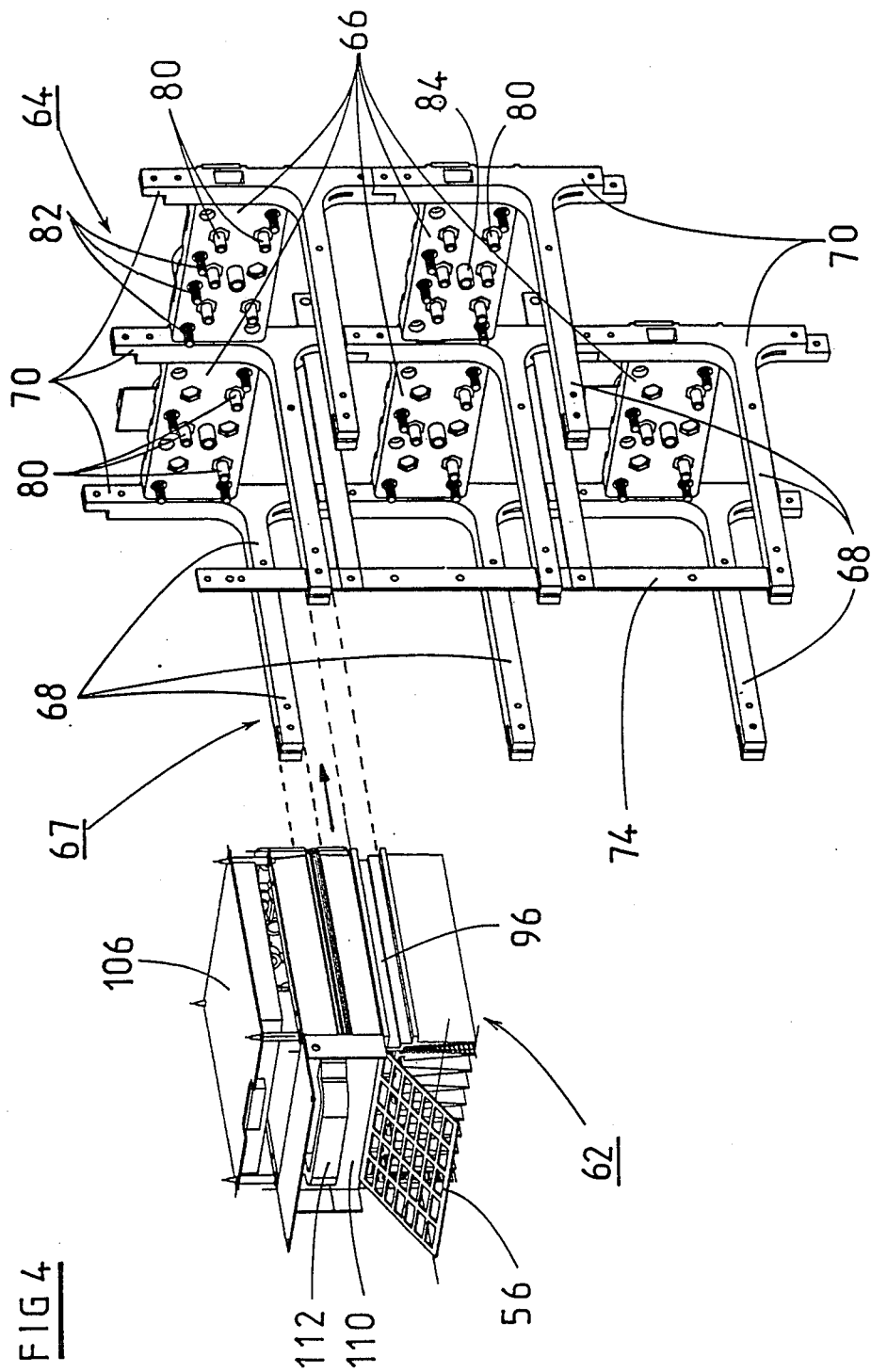
FIG. 4 is a perspective view of the fixed connecting base associated with a movable draw-in rack.
Figure 5:
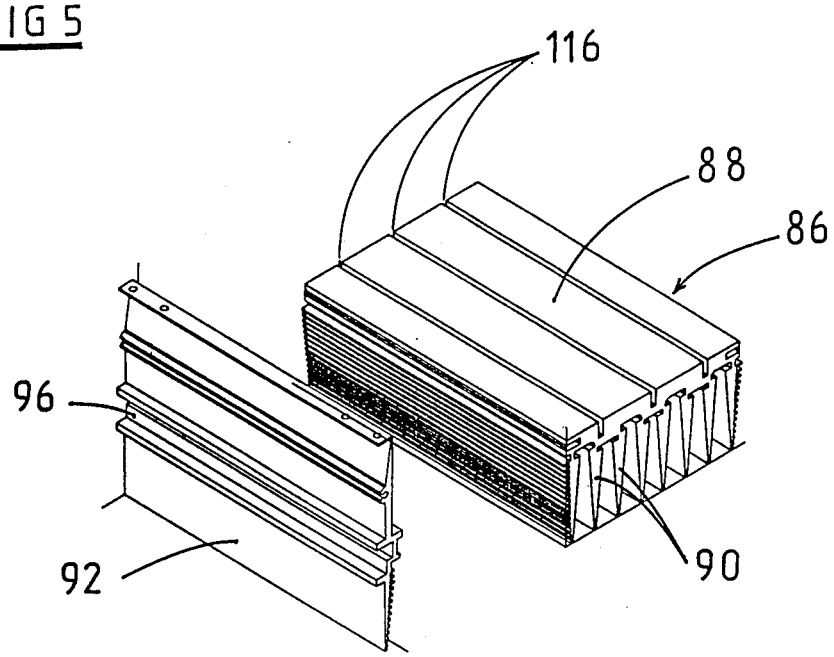
FIGS. 5 to 8 show the perspective views of the successive draw-in rack assembly operations.
Figure 6:
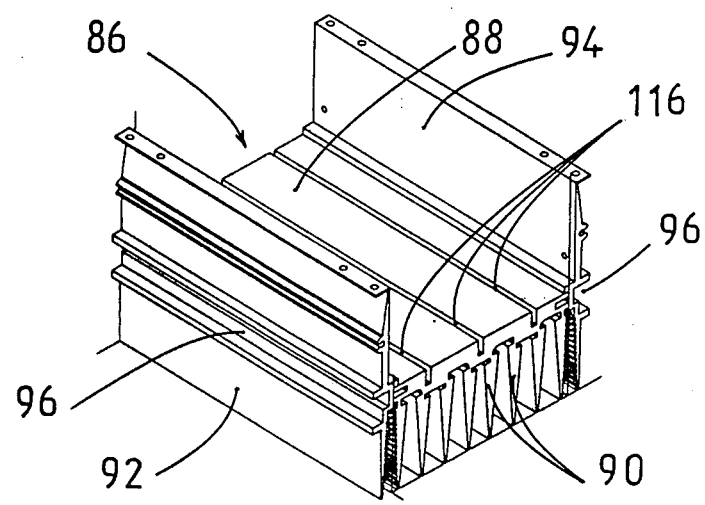
Figure 7:
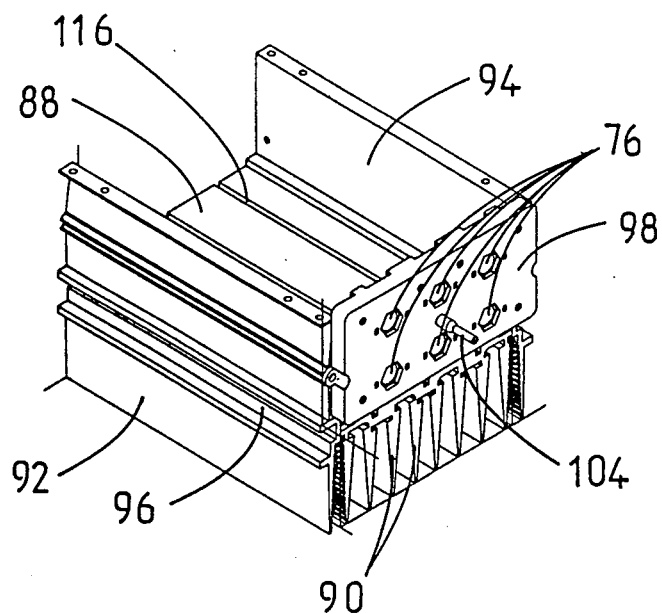
Figure 8:
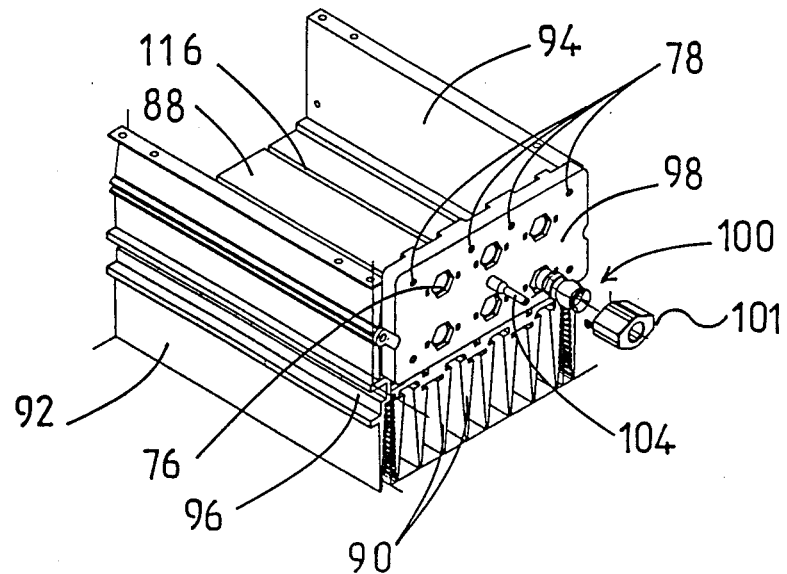
Figure 9:
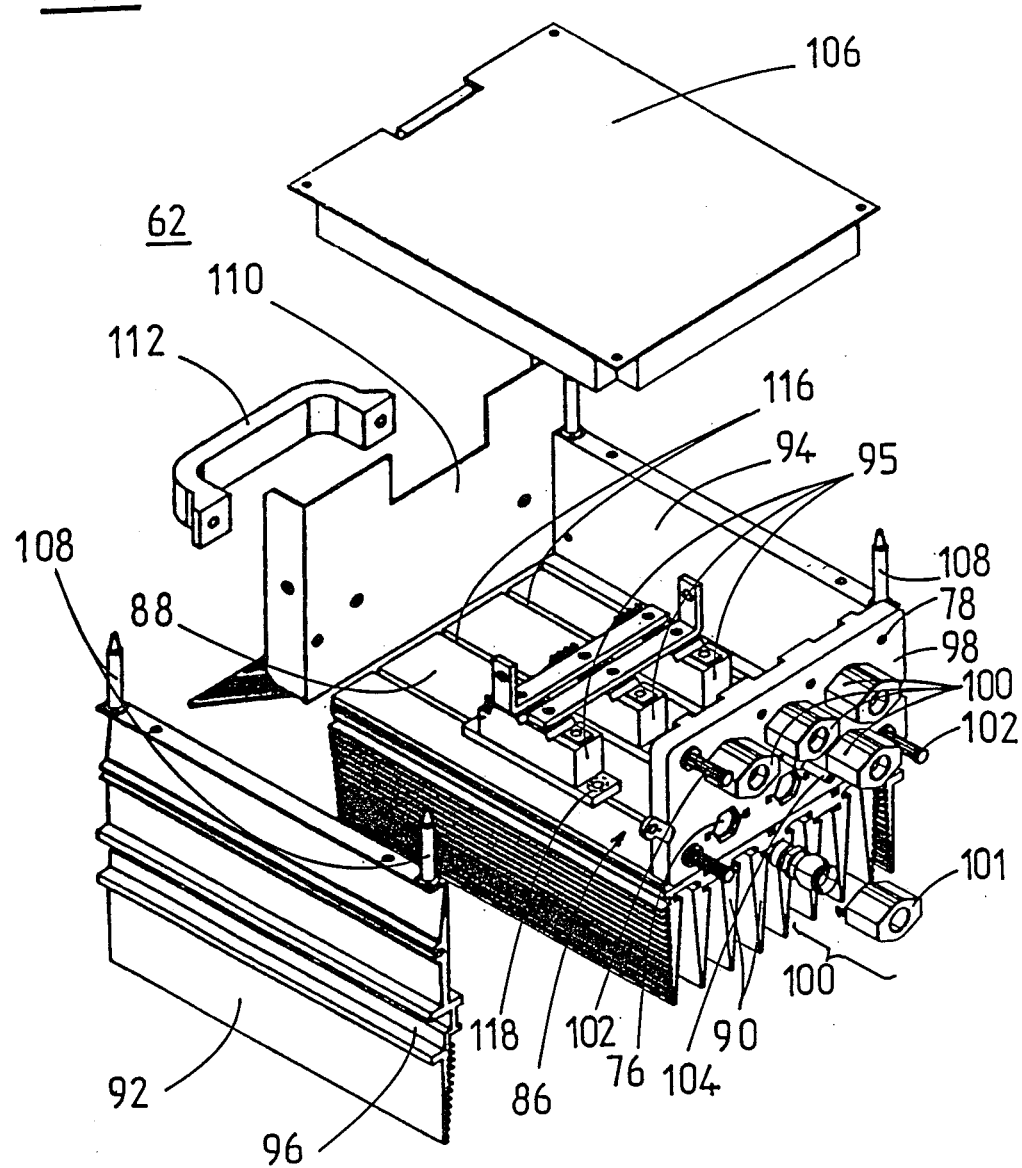
FIG. 9 is an exploded perspective view of a fully equipped rack.
Figure 13:
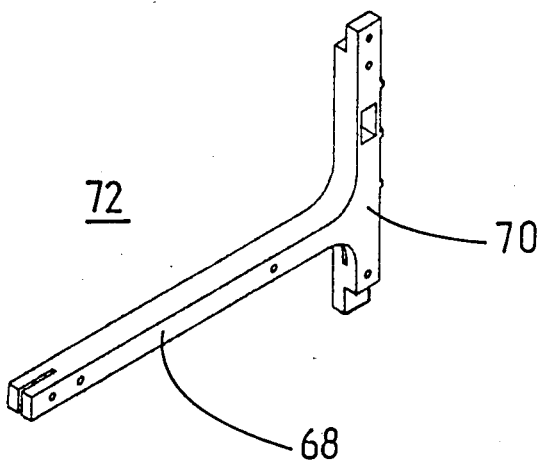
FIG. 13 represents a perspective view of a component part of the connecting base.

The different modules M1, M2, M3 of the inverter M, rectifier-charger CH, and normal/standby switch with static contactor CS, are made up of a plurality of juxtaposed elementary racks 62 plugged into a fixed connecting base 64 (see FIGS. 3 and 4). The base 64 comprises a series of draw-in support plates 66, as many as there are racks 62, and a guiding device 67 of the movable racks 62 in translation during the draw-in travel. The guiding device 67 is equipped with several parallel slides 68 in the form of straight arms extending towards the front panel 24 of the cubicle 12 in a perpendicular direction to the housing plane of the draw-in support plates 66. The slides 68 are supported by clip-on brackets 70 between which the different draw-in support plates 66 are inserted. A slide 68 and the corresponding bracket 70 are advantageously formed by a single standard T-shaped part 72 made of moulded insulating material, represented in detail in FIG. 13. Preliminary modular assembly by clipping together the various parts 72 and draw-in support plates 66 makes an extension of the connecting base 64 according to the number of draw-in racks 62 of the static power supply system 10 easy to achieve. Final assembly of the modular base 64 is then performed by an operation involving riveting of the different brackets 70.

The front ends of the superposed slides 68 housed in the vertical intermediate plane of the connecting base 64, are connected together by a ground conductor 74 (FIGS. 2 and 4), capable of interconnecting the heat sinks of the different electronic sub-assemblies, in the drawn-in position of the racks 62. This ground conductor 74 forms part of an internal ground system, which was the subject of the French Patent application No. 86 15620 filed on 5th Nov. 1986 by the applicant.

Figure 14:
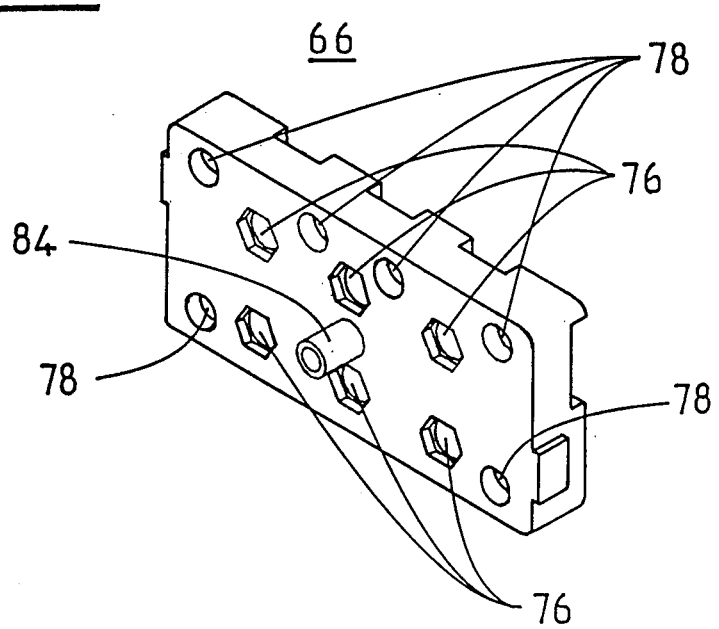
FIG. 14 shows a perspective view of an unequipped plate of the connecting base.

Each elementary support plate 66 of the connecting base 64 has a rectangular structure made of insulating material (see FIG. 14), having six hexagonal holes arranged in two superposed series of three holes, and six circular orifices 78, four of which are along the upper edge, and two at the bottom corners of the plate 66. The holes 76 are designed to receive pins or studs (80, FIG. 4) made of conducting material, whereas the orifices 78 can be blanked off by error prevention means 82 in the form of tenons or pins protruding out from the flat surface of the support plate 66. The central area of each support plate 66 comprises in addition a centering bush 84 of the movable rack 62.

The architecture of a draw-in rack 62 is represented in FIGS. 5 to 9. Each rack 62 comprises a base block 86 made of good heat-conducting material, having a heat sink base-plate 88 with cooling fins 90, and two side flanges 92, 94 fixed vertically to the opposite edges of the base-plate 88. The upper face of the heat-sink base-plate 88 is flat and acts as support for the electronic power components 95, notably transistors or thyristors. The cooling fins 90 are arranged along the lower face of the heat sink 88, extending downwards in a parallel direction to the flanges 92, 94. The external surface of each flange 92, 94 of the rack 62 is equipped with a longitudinal positioning groove 96 designed to cooperate, when draw-in takes place, with the corresponding slide 68 of the connecting base 64.

The rear face of each rack 62 is fitted with a plate 98 with tulip-finger type contacts 100; the structure of the plate 98 is similar to that of the support plates 66 (FIG. 14) of the fixed base 64, and comprises six hexagonal holes 76 to receive tulip-finger contacts 100, and six orifices 78 to receive error prevention means 102. The central area of the plate 98 with the contacts 100 comprises in addition a male positioning part 104 capable of engaging in the centering bush 84 of the adjoining plate 66 when the tulip-finger contacts 100 are drawn into the corresponding studs 80 of the connecting base 64. The tulip-finger contacts 100 are connected to the electronic semiconductor components 95 by connecting parts (not shown) located inside the rack 62 above the base-plate 88.

A printed circuit board 106 controlling the semi-conductor components 95 acts as cover for the rack 62, being fitted onto the side flanges 92, 94 by means of four spacers 108. The front panel of the rack 62 comprises a mounting plate 110 on which are fitted the ventilation air turbulence grates 56, and a handle 112 actuating the draw-in rack 62 in translation. Each tulip-finger contact 100 is protected by a tulip-finger cover 101.

The tulip-finger contacts 100 of the plate 98 of the racks 62 can naturally be replaced by draw-in contact grips.

Figure 10A:
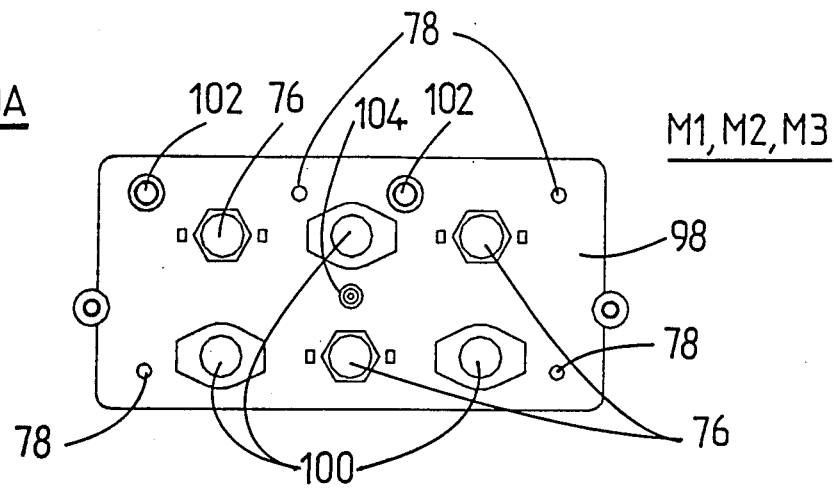
FIGS. 10 A, 10 B, 10 C represent the elevational views of the rear face of a connection plate of a rack, respectively for an inverter stack module, for a rectifier-charger module, and for a static contractor normal-standby module.
Figure 10B:
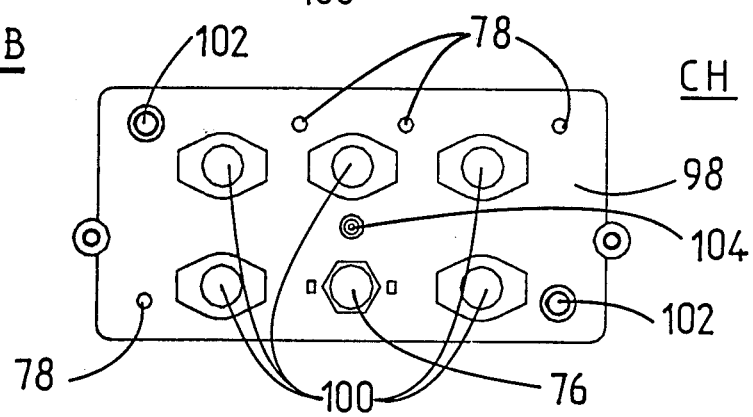
Figure 10C:
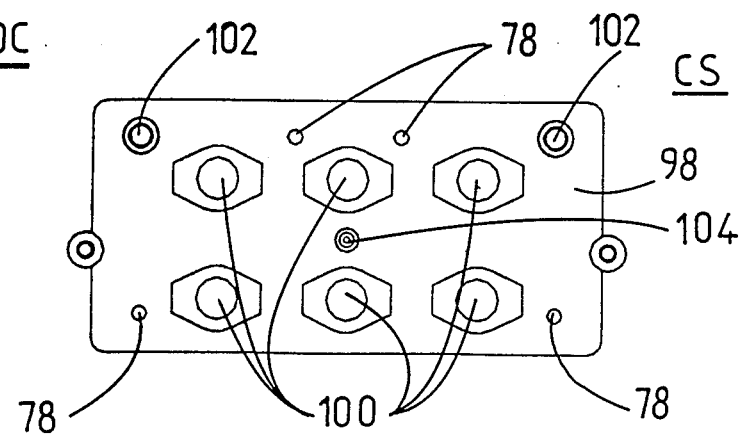

The uniform distribution of the holes 76 and orifices 78 on the respective plates 66, 98, of the base 64 and of the rack 62 enables a precise connection coding to be established according to the type and power of the modules constituting the static power supply system 10. FIGS. 10 A, 10 B and 10 C show the configuration of the plate 98 equipped with the connection and error prevention system of a movable rack 62 for each type of module, capable of operating in conjunction with the fixed connecting base 64 in FIG. 4. In FIG. 10 A relating to a stack module M1, M1, M3 of a phase of an inverter M, the three tulip-finger contacts 100 of the plate 98 can engage in the adjoining studs 80 of any one of the three superposed plates 66 located in the left-hand column of the base 64 (FIG. 4). The two error prevention means 102 of the plate 98 can engage in the orifices 78 remaining free in the above-mentioned plates 66, and reciprocally the four error prevention means 82 of the plates 66 can engage in the four orifices 78 remaining free in the plate 98.

In FIG. 10 B relating to a rectifier-charger module CH, the five tulip-finger contacts 100 of the plate 98 can engage in the corresponding five studs 80 of the plate 66 located at the top right of the base 64 in FIG. 4.

Figure 15:
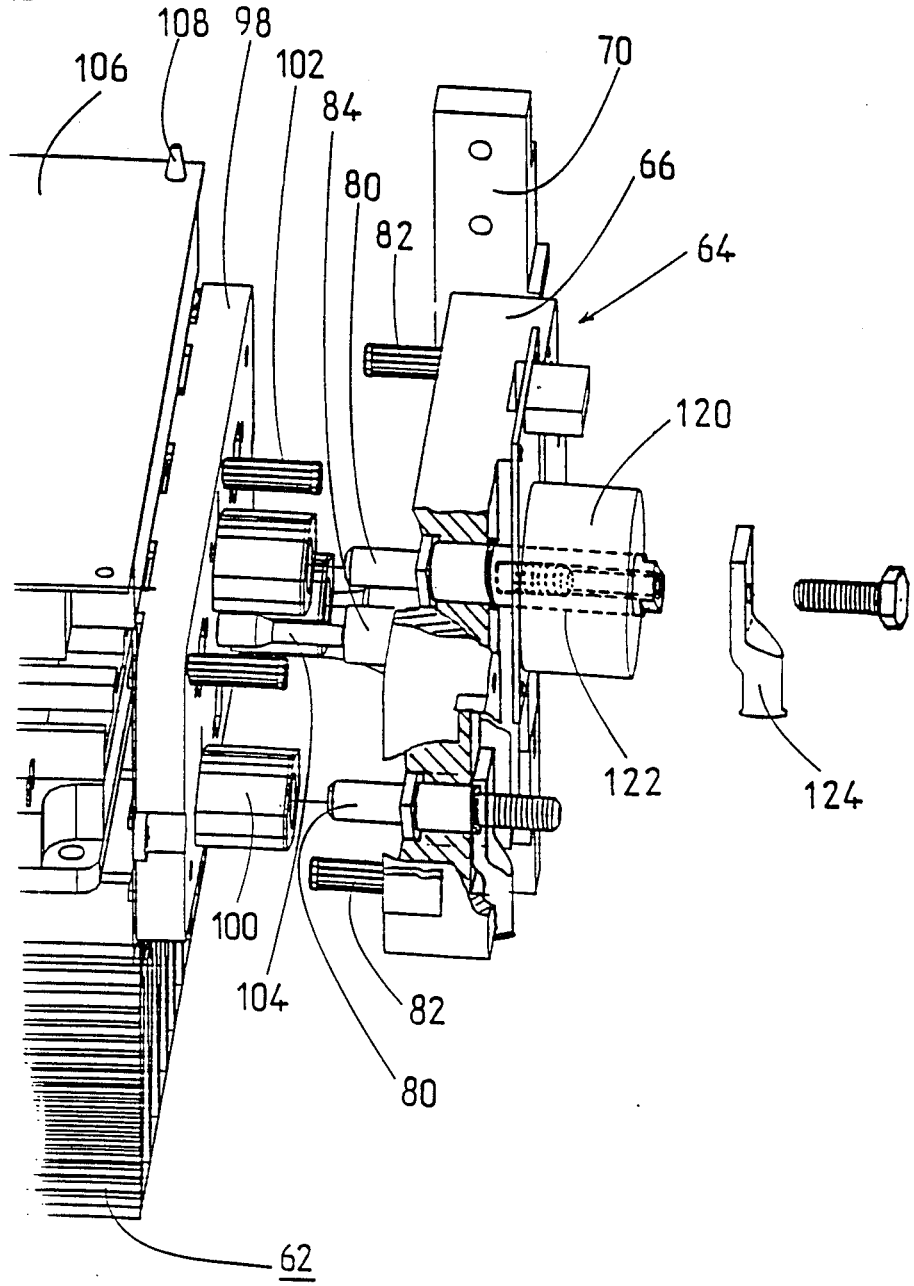
FIG. 15 represents a partial perspective view on an enlarged scale of the rear of a rack when it is drawn into the connecting base.

In FIG. 10 C relating to a normal-standby changeover module with static contactor CS, the six tulip-finger contacts 100 of the plate 98 can engage in the corresponding six studs 80 of the plate 66 located at the bottom right on the base 64 in FIG. 4. The reciprocal cooperation of the error prevention means 82, 102, on the two plates 66, 98, prevents any connection error when the different sub-assemblies are fitted in the cubicle 12 (see FIG. 15). The error prevention means 82, 102 are formed by pins.

Figure 11:
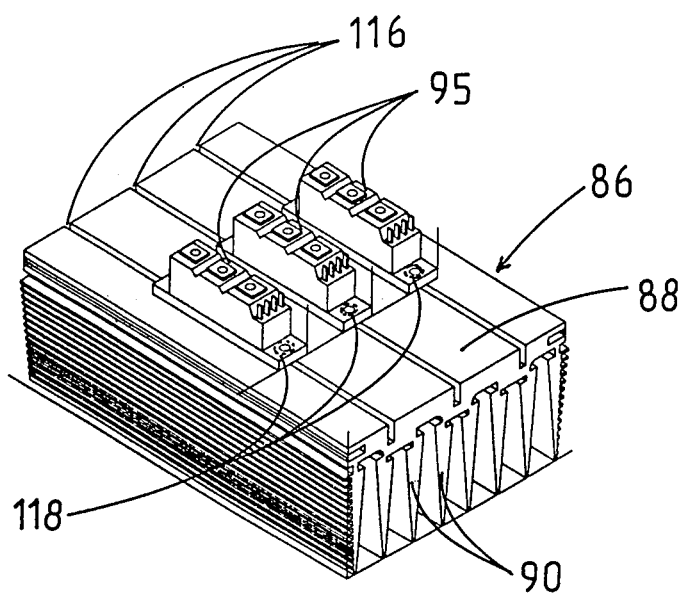
FIGS. 11 and 12 show two possible assemblies of the electronic power components on the heat-sink base-plate of a rack.
Figure 12:
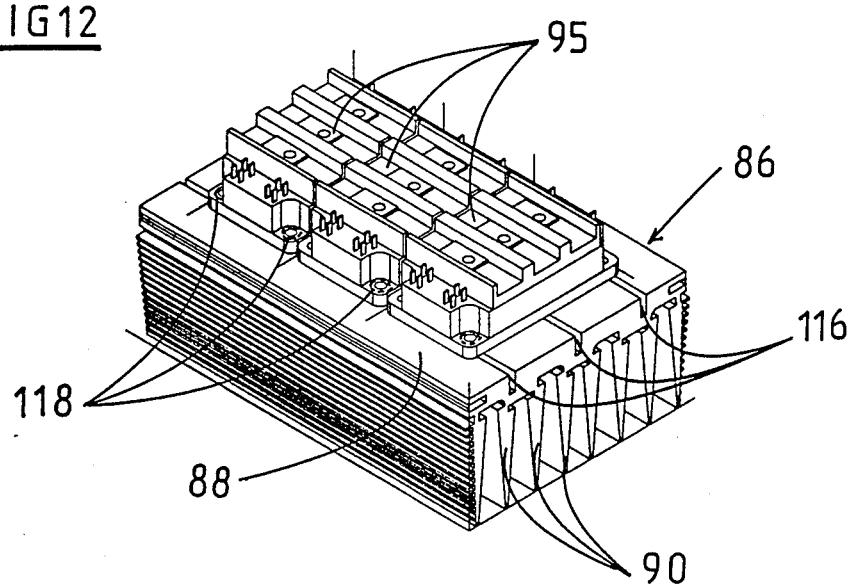

The upper face of the heat-sink base-plate 88 of each base block 86 is provided with several longitudinal grooves 116 extending parallel according to the direction of the flanges 92, 94. The electronic power components 95 are fixed onto the base-plate 88 by means of self-tapping screws 118 which can engage in the grooves 116 in any position. The components 95 can be arranged longitudinally (FIG. 11) or transversely (FIG. 12) on the base-plate 88. This configuration with grooves 116 enables the base block 86 to be standardized for all types of modules, and avoids any specific holes having to be drilled, and any further surfacing operations having to be carried out to remove the burrs resulting from drilling. The grooves 116 are made automatically when the aluminium alloy-based base-plate 88 is manufactured.

Current sensors 120 (FIG. 15) can equip some modules being fixed to the rear face of the connecting base 64, opposite the error prevention pins 82. Electrical connection of the sensors 120 is achieved by means of conducting bushings 122 which can be fitted onto conducting studs 80 of the plate 66. The current sensors can be achieved by current transformers or Hall effect cells. An outgoing feeder 124 can be fixed to the rear end of each bushing 122.

Figure 16:
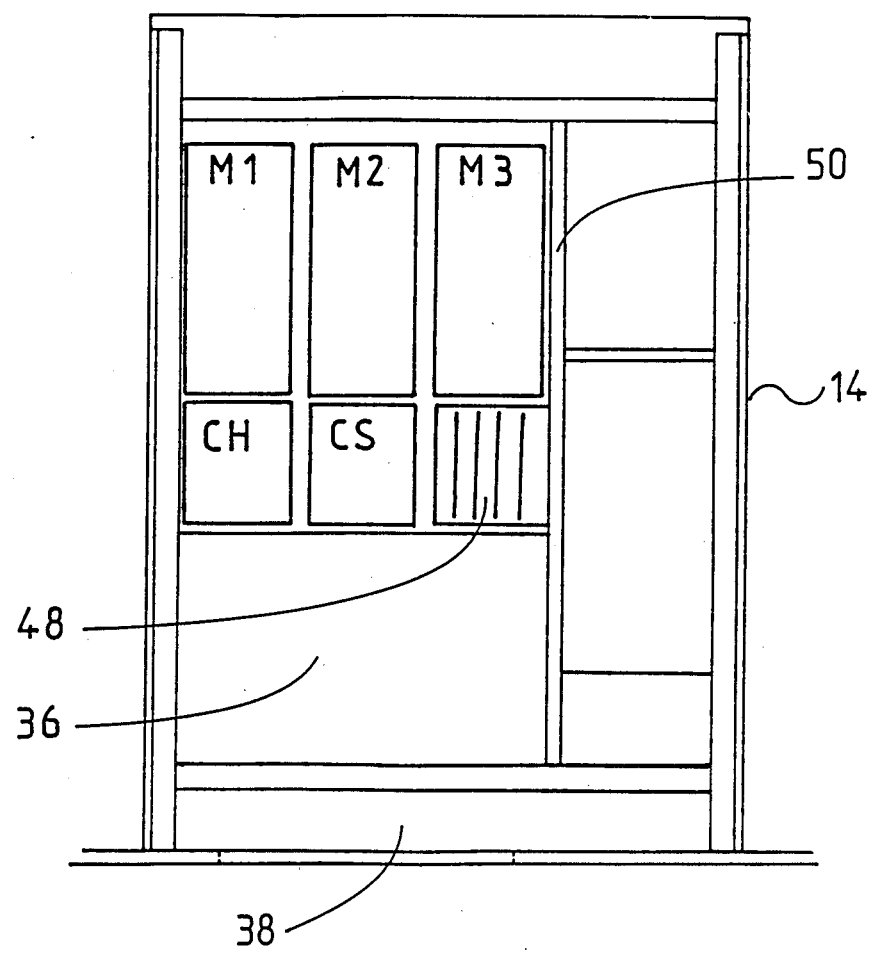
FIG. 16 represents an alternative embodiment of the cubicle according to FIG. 2.

The distribution of the different modules M1, M2, M3, CH, CS on the connecting base 64 can naturally be modified according to the type and power of the supply system 10. FIG. 16 shows an alternative embodiment of this kind wherein the three stack modules M1, M2 and M3 of the inverter M are located respectively above the rectifier-charger module CH, the static contactor module CS, and the printed circuit board rack 48.

We claim:

1. A static converter, especially for an uninterruptible electrical power supply system, having a plurality of electronic power modules, each module comprising:
    a heat sink unit with a heat dissipation base-plate, made of a good heat-conducting metallic material, comprising a support face acting as a support for the electronic power components, and an opposite face equipped with cooling fins,
    a pair of parallel flanges, laterally fixed to the opposite edges of the base-plate in a perpendicular direction to the support face,
    a connecting plate having draw-in contacts electrically connected to the electronic components, the module being arranged in a parallelipipedic rack capable of cooperating in translation with a fixed connecting base by drawing the plate contacts, made of insulated material, into adjoining studs of the base,
    each flange of the module being provided with a longitudinal groove to guide the rack when draw-in takes place by sliding along a slide securely united to the connecting base.

2. The static converter according to claim 1, wherein error prevention means are arranged in the gap separating said plate from the base to avoid any connection error, said connection plate with draw-in contacts extending between the flanges to constitute the rear face of the module.

3. The static converter according to claim 2, comprising:
    a series of pins and orifices arranged on the rack connection plate and on the base, to form said error prevention means designed to establish a predetermined connection coding of the module contacts with the aligned studs of the base,
    and a positioning device fixed to the central part of the connection plate with draw-in contacts to engage in a centering bush associated with the base.

4. The static converter according to claim 2, wherein the module connection plate comprises:
    six holes arranged in two superposed horizontal rows on the plate to receive the draw-in contacts formed by tulip-fingers or grips,
    and six orifices housing error prevention pins, four of the six orifices being located at the corners of the rectangular-shaped plate.

5. The static converter according to claim 1, comprising:
    a printed circuit board controlling the power components fitted on the upper edges of the two flanges and extending parallel to the support face of the heat-sink unit base-plate,
    a mounting plate equipped with an actuating handle fitted on the rack front panel,
    the fixed connecting base comprising at least one support plate of the draw-in studs, said support plate made of insulating material being inserted between two vertical brackets extended by two straight arms constituting said slides cooperating in sliding with the guide grooves of the flanges when the rack is drawn-in by means of the handle.

6. The static converter according to claim 5, wherein the corresponding bracket and slide assembly is achieved by casting a single T-shaped insulating part, the bracket having clip-on parts enabling modular assembly of the connecting base, the rear face of the connecting base, opposite the error prevention pins, acting as support for a current sensor electrically connected to the corresponding stud by means of a conducting bushing.

7. The static converter according to claim 1, wherein the support face of the heat-sink base-plate is provided with several staggered grooves, extending parallel in the direction of the flanges over the whole length of the block, in such a way as to enable any type of electronic components to be fitted by means of self-tapping screws.

8. A static converter for an uninterruptible electrical power supply system, having a plurality of draw-in electronic modules, housed in a parallelipipedic cubicle and comprising:
    a rectifier-charger whose input is connected to an AC mains system,
    an inverter connected to the rectifier-charger output for DC/AC conversion,
    a battery bank arranged as a buffer to constitute a permanently available power store at the inverter input,
    a metal frame of the cubicle, associated with blanking walls parallel two by two to delimit a front panel, a rear panel, and two opposite side panels extending depthwise in the cubicle,
    a ventilation unit designed to provide forced circulation of the cooling air of the modules inside the cubicle,
    an inlet orifice designed to suck fresh air into the cubicle,
    an outlet orifice designed to discharge the heated air to the outside,
    the draw-in modules being accessible via a door of the front panel and being located above the ventilation unit comprising at least one fan, the modules and fans assembly extending over a fraction of the depth of the cubicle, in such a way as to arrange a rear compartment acting as housing for a transformer controlling the inverter,
    a main discharge orifice of the fan being directed towards the front panel to establish a first internal cooling air path after pressurization of the air contained in a front space situated between the modules and the front panel,
    and a secondary discharge orifice of the fan being located opposite the main orifice, to generate a second internal cooling air path towards the transformer, the dimension of the secondary orifice being smaller than that of the main orifice.

9. The static converter according to claim 8, comprising:
    a support on which the fan and the transformer are secured,
    a space arranged between the support and the bottom of the cubicle to establish the suction path of the air coming from the inlet orifice,
    the two cooling air paths being independent from one another and arranged in parallel between the fan discharge orifices and the cubicle outlet orifice,
    the outlet orifice being located in proximity to the roof panel in the rear panel of the cubicle, a ventilation grate fitted on the outlet orifice for the upper volume of the cubicle to be able to communicate with the ambient air.

10. The static converter according to claim 8, wherein the front part of the frame comprises four T-shaped assembly brackets, capable of clipping at each corner into upper and lower crossmembers, and into opposing vertical flanges, the access door to the modules being supported by two hinges flush-mounted in two assembly brackets vertically arranged on the same side of the frame, each module comprising in addition a turbulence grate protruding into the rear space, in such a way as to cooperate with the outlet of the rising air coming from the main discharge orifice, and to generate a horizontal air circulation along the modules, and depthwise towards the outlet orifice.

* * * * *